US009086459B2

(12) United States Patent
Guo et al.

(10) Patent No.: US 9,086,459 B2
(45) Date of Patent: Jul. 21, 2015

(54) DETECTION AND DIAGNOSIS OF SCAN CELL INTERNAL DEFECTS

(75) Inventors: Ruifeng Guo, Portland, OR (US); Liyang Lai, Wilsonville, OR (US); Yu Huang, Sudbury, MA (US); Wu-Tung Cheng, Lake Oswego, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 412 days.

(21) Appl. No.: 12/918,986

(22) PCT Filed: Feb. 23, 2009

(86) PCT No.: PCT/US2009/034931
§ 371 (c)(1),
(2), (4) Date: Apr. 21, 2011

(87) PCT Pub. No.: WO2009/105787
PCT Pub. Date: Aug. 27, 2009

(65) Prior Publication Data
US 2011/0191643 A1    Aug. 4, 2011

Related U.S. Application Data

(60) Provisional application No. 61/030,557, filed on Feb. 21, 2008, provisional application No. 61/079,806, filed on Jul. 10, 2008.

(51) Int. Cl.
G01R 31/28      (2006.01)
G01R 31/3185    (2006.01)
G01R 35/00      (2006.01)

(52) U.S. Cl.
CPC ......... *G01R 31/318583* (2013.01); *G01R 31/318541* (2013.01); *G01R 35/00* (2013.01)

(58) Field of Classification Search
CPC .......... G01R 31/318583; G01R 31/318541; G01R 35/00; G01R 31/318547; G01R 31/318335; G01R 31/318385; G01R 31/318572; G01R 31/318552; G01R 31/318536; G01R 31/31704; G01R 31/31; G06F 11/267; G06F 11/27; G06F 17/505; G06F 17/5022; G06F 17/5031
See application file for complete search history.

(56) References Cited

U.S. PATENT DOCUMENTS

| | | | | |
|---|---|---|---|---|
| 5,303,246 | A * | 4/1994 | Anderson et al. | 714/727 |
| 5,831,992 | A * | 11/1998 | Wu | 714/732 |
| 6,360,344 | B1 * | 3/2002 | Khoche et al. | 714/733 |
| 7,234,092 | B2 * | 6/2007 | Cooke | 714/728 |
| 7,296,249 | B2 * | 11/2007 | Rinderknecht et al. | 716/106 |
| 7,908,532 | B2 * | 3/2011 | Eckelman et al. | 714/726 |
| 2003/0188243 | A1 * | 10/2003 | Rajan | 714/731 |
| 2003/0229834 | A1 * | 12/2003 | Cooke | 714/726 |
| 2005/0081130 | A1 * | 4/2005 | Rinderknecht et al. | 714/726 |
| 2005/0222816 | A1 * | 10/2005 | Cheng et al. | 702/185 |
| 2006/0111873 | A1 * | 5/2006 | Huang et al. | 702/185 |
| 2007/0255988 | A1 * | 11/2007 | Wang et al. | 714/726 |
| 2008/0010573 | A1 * | 1/2008 | Sul | 714/731 |
| 2009/0132880 | A1 * | 5/2009 | Wang et al. | 714/731 |
| 2009/0210763 | A1 * | 8/2009 | Eckelman et al. | 714/731 |

* cited by examiner

Primary Examiner — Guerrier Merant
(74) Attorney, Agent, or Firm — Klarquist Sparkman, LLP

(57) ABSTRACT

A diagnosis technique to improve scan cell internal defect diagnostic resolution using scan cell internal fault models.

14 Claims, 4 Drawing Sheets

Scan cells with observed failures on a tester

A defect at scan cell 3 corrupts scan load values of downstream scan cells, i.e. scan cells 0, 1, 2 and 3.
In our simulation, we change its downstream scan cell load value to X in order to mask the defect impact to scan load process Observed failure at scan cell 1:
    It doesn't go through scan cell 3 during scan unload
Observed failure at scan cell 4:
    goes through scan cell 3 at scan unload shift cycle 1
Observed failure at scan cell 6:
    goes through scan cell 3 at scan unload shift cycle 3

DETECTION AND DIAGNOSIS OF SCAN CELL INTERNAL DEFECTS

RELATED APPLICATIONS

This application is the national stage of International Application No. PCT/US2009/034931, entitled "Detection and Diagnosis of Scan Cell Internal Defect", which claims priority to U.S. Provisional Patent Application No. 61/030,557, entitled "Detection And Diagnosis Of Scan Cell Internal Defect," filed on Feb. 21, 2008, and naming Ruifeng Guo, Liyang Lai, Yu Huang, and Wu-Tung Cheng as inventors, which applications are incorporated entirely herein by reference. PCT International Application No. PCT/US2009/034931 also claims priority to U.S. Provisional Patent Application No. 61/079.806, entitled "Detection And Diagnosis Of Scan Cell Internal Defect," filed on Jul. 10, 2008, and naming Ruifeng Guo, Liyang Lai, Yu Huang, and Wu-Tung Cheng as inventors, which application is incorporated entirely herein by reference as well.

FIELD OF THE INVENTION

The present invention is directed to performing techniques that can be used to detect and diagnose scan cell internal defects.

BACKGROUND OF THE INVENTION

Scan-based design and testing has been widely adopted to reduce the cost of testing VLSI circuits. Scan-based logic diagnosis techniques have been very helpful in assisting physical failure analysis engineers to quickly root-cause defect mechanisms. A functioning scan chain is critical to test the system logic through scan-based test patterns. When there is a defect inside the scan chain logic, it is important to root-cause and fix the problem before scan test patterns can be used to test system logic.

A defect in a scan chain usually impacts scan pattern load and unload operations and causes massive failures on an ATE (automatic test equipment). During production test, usually a scan chain test pattern is applied on the circuit to check the integrity of scan chains. A scan chain test pattern can consist of scan load and scan unload operations only. The commonly used scan chain test pattern contains repeating 0011s. If a scan chain fails a scan chain test pattern, it indicates that the scan chain is not functioning properly. For a circuit that fails a scan chain test pattern, scan chain failure diagnosis technique(s) is/are typically used to identify the area of interest before physical failure analysis. One form of scan chain failure diagnosis takes a tester failure log, circuit netlist, and scan test patterns as inputs and reports a list of suspects with diagnostic scores to show the confidence that a suspect has a defect in it. Scan chain failure diagnosis is nondestructive and accurate and can make physical fault isolation much easier.

Research into scan chain failure mechanisms and their diagnosis techniques have advanced in the last decade. Hardware-based, tester-based and software-based scan chain failure diagnosis techniques have been used to isolate defects in a scan chain. While hardware-based and tester-based diagnostic techniques are very powerful in isolating scan chain defects, they are usually more expensive than software-based diagnosis techniques, either due to expensive tester time or due to expensive special design support.

Most research in the direction software-based scan chain failure diagnosis techniques uses conventional fault models including stuck-at, transition and hold-time faults to model the behavior of scan chain defects. For example, a scan cell stuck-at-0 fault usually models a defective scan cell where the output of the scan cell can only propagate a binary value "0" onto its next scan cell. These fault models have been successfully used in state of the art scan chain failure diagnosis techniques. With the advancement of manufacturing process from 90 nm to 65 nm and beyond, a significant number of manufacturing defects lie inside design library cells. The behavior of such defects is becoming more complicated and traditional fault models are no longer sufficient to model this complicated defect behavior. The complicated defect behavior has driven recent advancements in circuit testing and fault diagnosis technologies. To improve test pattern quality and defect coverage, designers have been using advanced fault models to improve test pattern quality. To improve logic fault diagnosis accuracy and precision, designers have been tracking down into design cells to find the defect location, or using more general fault models to model the behavior of a complicated defect in order to understand the behavior of the defect. Library cell internal fault reports show that some defects do not show up as perfect stuck-at faults or transition faults. Instead, the output of a library cell depends on the input combinations of a given library cell.

BRIEF SUMMARY OF THE INVENTION

Various examples of the invention are related to software-based scan chain failure diagnosis techniques. While some publications have studied the impact of cell internal defects inside a library cell in system logic, various implementations addresses the behavior of a defect inside a scan cell. Note that, in comparison to a defect inside a library cell in system logic that impacts only the scan capture operations when the fault effect is propagated to some scan cells, a defect inside a scan cell can impact not only the scan capture process, but also the scan chain load and unload shifting process.

Disclosed below are representative embodiments of methods, apparatus, and systems for performing scan cell internal defect detection and diagnosis that should not be construed as limiting in any way. Instead, the present disclosure is directed toward all novel and nonobvious features and aspects of the various disclosed methods, apparatus, and systems, alone and in various combinations and subcombinations with one another. The disclosed technology is not limited to any specific aspect or feature, or combination thereof, nor do the disclosed methods, apparatus, and systems require that any one or more specific advantages be present or problems be solved.

Any of the methods, apparatus, and systems described herein can be used in conjunction with a wide variety of scan-based or partially-scan-based circuits and in connection with a wide variety of diagnostic procedures.

Although the operations of some of the disclosed methods are described in a particular, sequential order for convenient presentation, it should be understood that this manner of description encompasses rearrangement, unless a particular ordering is required by specific language set forth below. For example, operations described sequentially may be rearranged or performed concurrently. Moreover, for the sake of simplicity, the figures may not show the various ways in which the disclosed methods, apparatus, and systems can be used in conjunction with other methods, apparatus, and systems. Additionally, the description sometimes uses terms like "determine," "identify," and "constrain" to describe the disclosed technology. These terms are high-level abstractions of the actual operations that are performed. The actual operations that correspond to these terms may vary depending on the particular implementation and are readily discernible by one of ordinary skill in the art.

As used in this application, the singular forms "a," "an" and "the" include the plural forms unless the context clearly dictates otherwise. Additionally, the term "includes" means "comprises." Moreover, unless the context dictates otherwise, the term "coupled" means electrically or electromagnetically connected or linked and includes both direct connections or direct links and indirect connections or indirect links through one or more intermediate elements not altering the intended operation of the circuit.

The disclosed embodiments can be implemented in a wide variety of environments. For example, any of the disclosed techniques can be implemented in software comprising computer-executable instructions stored on computer-readable media (e.g., one or more CDs, volatile memory components (such as DRAM or SRAM), or nonvolatile memory components (such as hard drives)). Such software may comprise, for example, electronic design automation ("EDA") software (e.g., an automatic test pattern generation ("ATPG") tool) used to generate test patterns for testing one or more circuits (e.g., an application specific integrated circuit ("ASIC"), a programmable logic device ("PLD") such as a field-programmable gate array ("FPGA"), or a system-on-a-chip ("SoC") having digital, analog, or mixed-signal components thereon). Such software may also comprise, for example, EDA software used to diagnose test responses to chain diagnosis test patterns applied to the one or more circuits. These particular software implementations should not be construed as limiting in any way, however, as the principles disclosed herein are generally applicable to other software tools.

Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For the same reason, computer hardware is not described in further detail. For example, the disclosed embodiments can be implemented using a wide variety of commercially available computer systems and/or testing systems. Any of the disclosed methods can alternatively be implemented (partially or completely) in hardware (e.g., an ASIC, PLD, or SoC).

Further, test patterns or diagnostic results (including any intermediate or partial test patterns or diagnostic results) produced from any of the disclosed methods can be created, updated, or stored on computer-readable media (e.g., one or more CDs, volatile memory components (such as DRAM or SRAM), or nonvolatile memory components (such as hard drives)) using a variety of different data structures or formats. Such test patterns and/or diagnostic results can be created or updated at a local computer or over a network (e.g., by a server computer).

The one or more integrated circuits being tested may additionally comprise specialized hardware components used to implement the testing (e.g., compression hardware). Such integrated circuits can be used in a vast assortment of electronic devices, ranging from portable electronics (such as cell phones, media players, and the like) to larger-scale items (such as computers, control systems, airplanes, automobiles, and the like). All such items comprising integrated circuits tested with embodiments of the disclosed technology or equivalents are considered to be within the scope of this disclosure.

Moreover, any of the disclosed methods can be used in a computer simulation, ATPG, or other EDA environment, wherein test patterns, test responses, and compressed test responses are determined by or otherwise analyzed using representations of circuits, which are stored on one or more computer-readable media. For presentation purposes, however, the present disclosure sometimes refers to a circuit or its components by their physical counterpart (e.g., scan cells, primary outputs, paths, circuits, and other such terms). It should be understood, however, that any reference in the disclosure or the claims to a physical component includes representations of such circuit components as are used in simulation, ATPG, or other such EDA environments.

DETAILED DESCRIPTION OF THE INVENTION

Exemplary Operating Environment

Figure 1:
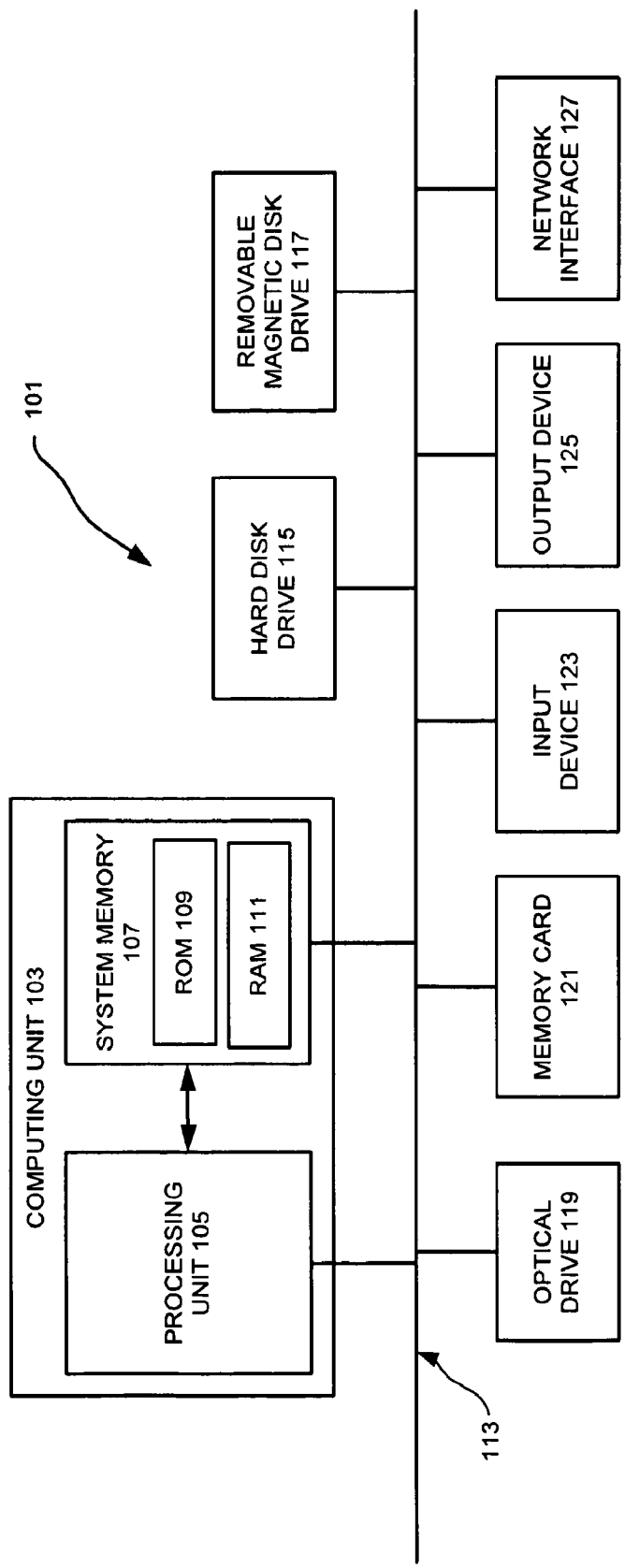
FIG. 1 shows an illustrative example of a computing device that may be employed with various embodiments of the invention.

Various examples of the invention may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it not intended to be limiting. Various embodiments of the invention may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Overview

Each scan cell in a scan chain can be given an index. The cell connected to scan chain output can be numbered 0 and the cells in the scan chain can be numbered incrementally from scan chain output to scan chain input sequentially. The scan cell with index N can be referred to as scan cell N. For purposes of explanation, (a) Downstream scan cells of a scan cell N are the scan cells between the scan cell N and the scan chain output; and (b) Upstream scan cells of a scan cell N are the scan cells between the scan cell N and the scan chain input. During a scan load process, a defective scan cell can corrupt the scan load values of its downstream cells. During scan unload process, a defective scan cell can corrupt the scan unload values of its upstream scan cells.

For a defective chip, while applying a set of test patterns, the failures observed on a tester are herein called observed failures. During diagnostic fault simulation, each candidate fault will have mismatches from the expected responses. These mismatches are herein called candidate simulation failures from diagnostic fault simulation. During a diagnosis process, a better match between candidate simulation failures and the observed failures usually indicates a higher probability that the candidate is an actual or real defective site.

Figure 2:
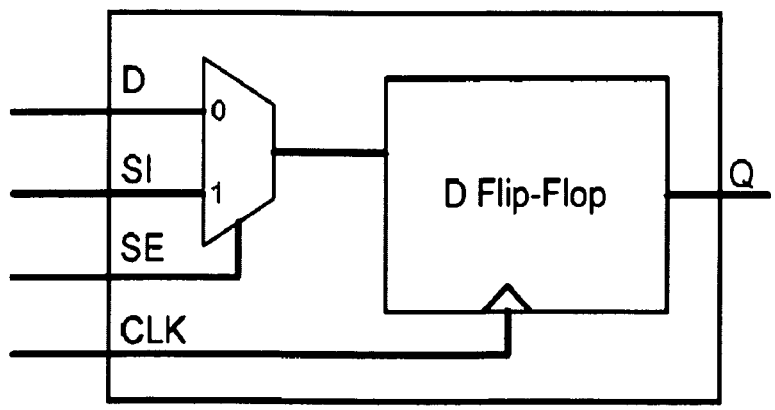
FIG. 2 an example of a Mux-D scan cell.

A scan cell internal defect is a defect, such as a manufacturing defect inside a scan cell. Such a defect usually causes the malfunction of a scan cell and a scan chain and can eventually cause massive failures on a tester. FIG. 2 shows a typical MUX-D type of scan cell. Inside the scan cell boundary, a defect, for example, could lie on an interconnect wire between two transistors, on a local scan enable or scan clock line, or inside a transistor. For some scan cell internal defects, their behavior might be modeled by simple stuck-at and timing fault models. In contrast, some scan cell internal defects can have more complicated behavior such that traditional fault models may not be sufficient to model their impacts.

For purposes of providing an example, this disclosure uses a commonly used simple MUX-D type scan cell design as shown in FIG. 1, including in experiments discussed herein. While different styles of scan cell designs can be used in practical designs, the analysis method disclosed herein can be applied to other scan cells as well. For a fault-free MUX-D scan cell as shown in FIG. 1, during a scan shift operation, the input SE is held at a constant "1". After applying a clock cycle at the CLK pin, the logic value at the scan cell input SI will be propagated from SI to Q. During a scan capture operation, the input SE is held at constant "0". After applying a clock cycle at CLK pin, the logic value at scan cell input D will be propagated from D to Q. However, when there is a defect inside this scan cell, the scan cell output Q may not be at the expected value. The behavior of scan cell internal defects is discussed in greater detail below.

Behavior of Scan Cell Internal Defect

To study the effect of scan cell internal defects, a series of SPICE-simulation based experiments have been conducted. The purpose of these experiments was to gain an improved understanding of the behaviour of a scan cell internal defect. Through these experiments, it has been determined that the behaviour of some scan cell internal defects cannot be modelled by traditional fault models. A defect truth table is presented to describe the behaviour of a scan cell internal defect.

In experiments, resistive shorts and open defects were injected in a scan cell as scan cell internal defects. A resistive short defect can be modelled by a small resistance between two originally unconnected nets. The resistance used in this experiment was 100Ω, while an open defect can be modelled by inserting a 109Ω resistor at the target open net or pin. The defect locations were randomly selected inside the scan cell. The locations included all cell internal transistors, interconnections and scan cell boundary pins. A MUX-D type scan cell design using TSMC 90 nm technology was used in the simulation. There are total 37 transistors in this exemplary scan cell. This scan cell has four input pins (D, SI, SE, CLK) and one output pin Q, as shown in FIG. 2.

Figure 3:
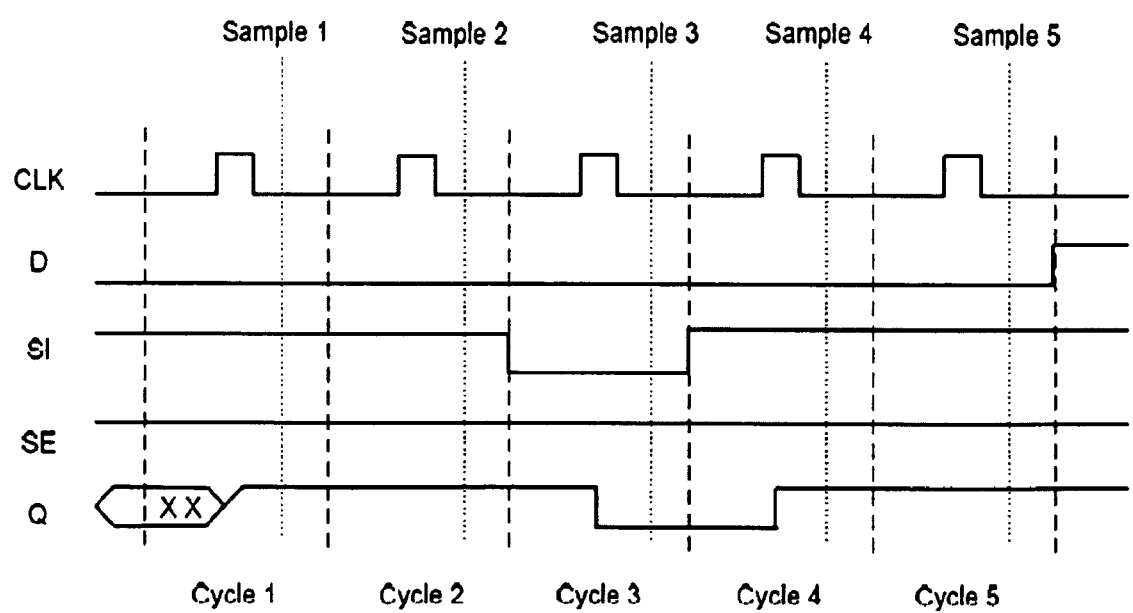
FIG. 3 illustrates an example of a SPICE waveform.

Each time a single defect was injected into the scan cell and then a SPICE simulation was performed with different input value combinations for each clock cycle. An input combination may correspond to a scan shift cycle or a scan capture cycle depending upon the value of scan enable input SE. During SPICE simulation, the CLK input was a free-running clock. It was assumed in this example that there were no setup or hold time violations for input signals (D, SI, SE) with respect to CLK. The values on the inputs (D, SI, SE) and the output Q were sampled after each clock pulse as shown in FIG. 3. In each clock cycle, the scan cell inputs D, SI and SE were assumed to keep constant values while the scan clock signal finished one clock cycle and that the scan cell output received its new value at the rising edge of the clock signal. Assume that the input combination on scan cell inputs (D, SI, SE) is $V_i$ for the current clock cycle and $V_{i-1}$ for the previous clock cycle. The input driver in SPICE was designed such that all possible combinations of ($V_{i-1}$, $V_i$) were enumerated.

In the experiments, 325 resistive shorts and 121 open defects were injected in the scan cells. The experimental results are summarized in Table 1 and Table 2, respectively. The defect behavior can be classified into two categories, namely: (1) detected; and (2) undetected. If a defective scan cell presents the same behavior as the defect-free scan cell, then the defect is undetected; otherwise it is detected. The detected defects can be further divided into static defects and non-static defects according to how a defect is detected. In the case of static defects, scan cell output Q values are only dependent on its input value combination (D, SI, SE) right before the current clock pulse. For static defects, given the same scan cell input values, they always produce the same scan cell output value after a clock pulse. Non-static defects are those defects that are detected but do not behave as static defects. For non-static defects, the output value of a defective scan cell doesn't directly depend on the input combination before the clock pulse. For the same input combination, different output values might be produced at the output of a defective scan cell. It should be noted that the defect behavior can vary somewhat with changing simulation parameters, such as short resistance value or clock frequency.

TABLE 1

Experiments Summary on Short Defect

| Total short defects: 325 cases | | | |
|---|---|---|---|
| Detected 259 | | | Undetected 66 |
| Static 197 | | Non-static | |
| SA0 | SA1 | Non-stuck-at | 62 |
| 53 | 47 | 97 | |

TABLE 2

Experiments Summary on Open Defect

| Open Defect Cases: 121 cases | | | |
|---|---|---|---|
| Detected: 82 | | | Undetected |
| Static 33 | | Non-static | 39 |
| SA0 | SA1: 10 | Non-stuck-at 3 | 49 |
| 20 | | | |

It is expected that a few injected defects may not be detected if the injected bridge or open resistance is not small or big enough to override the good machine signals. For defects that behave as static defects, some cause the scan cell to output a constant value no matter what the input values. This kind of defect behavior can be modeled by a conventional scan cell stuck-at-0 or stuck-at-1 fault. On the other hand, many static defects cannot be modeled by a stuck-at-0 or stuck-at-1 fault, and they are listed as non-stuck-at in Table 1 and Table 2. The detection and diagnosis of these defects will be further explored below.

From Table 1 and Table 2, some defects were detected but did not behave as static defects. They are called non-static defects. Non-static defects are more complicated than static defects and are not as straightforward to model. One observation is that a non-static defect can cause oscillations such that the output value is unpredictable. Another observation is that a non-static defect can cause extra delay on input pins such that the defects behave as timing defects, such as hold-time or transition defects. A non-static defect can also be sequence-dependent.

A non-static defect requires a more dedicated SPICE driver to fully characterize its defect behavior. The disclosure below focuses on the example of static scan cell internal defects, where the output of a scan cell is determined by the combination of its input values of a previous clock cycle. For each faulty scan chain, one can assume that there is only a single defective scan cell. The scan cell internal defects where the defective scan cell output is determined by not only the input combination, but also other factors (e.g. a sequence of input combinations, current state values of internal node or scan cell output node), are more complicated.

For a static scan cell internal defect, its behavior can be described by a defect truth table. An example internal defect truth table for a static scan cell internal defect is shown in Table 3. Similar to a logic gate truth table, a defect truth table contains the cell input combinations and their corresponding scan cell outputs. When creating a defect truth table for a scan cell internal defect, in this example, the scan cell output value is determined by the scan cell input values right before the shift clock. For example, for the MUX-D scan cell shown in FIG. 2, the output value of the scan cell at cycle C+1 is determined by the input values of the data input port, scan data input and scan enable pin. As shown in Table 3, when the input combinations are "001", the expected good scan cell output is "0", while the defective scan cell has a value "1". The defect truth table shown in Table 3 shows a defect with complicated behaviors that impact both a scan capture operation (when SE is "0") and a scan shift operation. The faulty values in this example are 0 or 1, depending on the scan cell input values. Note that in the specific example discussed herein, a very simple MUX-D scan cell design was used with a data input, a clock input, a scan data input and a scan enable. In practice, when a scan cell contains set/reset input pins, these pins would also typically be included in a defect truth table. Scan cells used in industrial designs usually have less than ten input pins, making their defect truth tables easily manageable.

TABLE 3

An Example Scan Cell Internal Defect Truth Table

| Input values (SE, D, SI) | Expected output $Q_{exp}$ | Defective output $Q_f$ |
|---|---|---|
| 0 0 0 | 0 | 0 |
| 0 0 1 | 0 | 1 |
| 0 1 0 | 1 | 0 |
| 0 1 1 | 1 | 1 |
| 1 0 0 | 0 | 0 |
| 1 0 1 | 1 | 0 |
| 1 1 0 | 0 | 1 |
| 1 1 1 | 1 | 1 |

Among all of the static scan cell internal defects in Table 1 (resistive shorts), about half of them behave as stuck-at-0 or stuck-at-1 at the scan cell output. Among all of the static scan cell internal defects in Table 2 (open defects), about 90% of them behave as stuck-at-0 or stuck-at-1 at the scan cell output. These defects can be modeled by stuck-at-0 fault and stuck-at-1 fault. The other static scan cell internal defects in Tables 1 and 2 do not behave as a constant stuck-at-0 or stuck-at-1 at the scan cell output. That is, their value can be 0 for some input combinations and can be 1 for some other input combinations. Since the detection and diagnosis of scan cell stuck-at faults have been well studied in the past, the disclosure below focuses on the static defects that are not showing as stuck-at faults.

Detection of Scan Cell Internal Defects

From the scan cell internal defect simulation described in the above section, for each scan cell internal defect, one can create a defect truth table based on the behavior of the defect. The defect truth table describes the output values of the defective scan cell for all of its possible input combinations. In this portion of the disclosure, an industrial design is used to evaluate the behavior of scan cell internal defects. The design profile is shown in Table 4, below (where the ScanChainLength is the length of the longest scan chain).

TABLE 4

An Industrial Design

| #Gates | 70K |
|---|---|
| #ScanChains | 8 |
| ScanChainLength | 725 |
| Scan cell design | Mux-D scan cell |
| #ScanPatterns | 948 |
| Stuck-at fault coverage | 99.9% |

An exemplary flow is setup as follows: once the defect truth table of a scan cell internal defect is obtained, one of the scan cells in the design is replaced with the defective scan cell. During the simulation process, each scan shift cycle is simulated so that the output value from the defective scan cell can be determined and propagated to its next scan cell. While simulating each shift cycle, the output value of the defective scan cell is determined based on the defect truth table and the input value combinations of the defective scan cell.

As shown in Tables 1 and 2, there are total 100 non-stuck-at static scan cell internal defects, of which 26 were chosen in experiments. For each of these 26 defects, in an experiment, three scan cells were randomly selected for fault injection; which makes up a total of 78 scan cell internal faults for this experiment. Production test patterns were used to simulate these scan cell internal faults. The simulation of scan cell internal faults required simulation of each scan load and unload shift cycle, which is a time-consuming process. In this experiment, the simulation included the chain test pattern and the first 100 scan test patterns from the production test set. The scan chain test pattern in the production test contained repeating "0011"s. Table 4 shows the detection status of the 78 scan cell internal defects.

Note that, in Table 5, there are 25 scan cell internal defects that passed the regular chain test pattern but failed scan test patterns. Among these 25 scan cell internal defects, the defect truth tables were further analyzed. It was determined that 21 of the scan cell defects actually didn't impact scan cell shift operations and only impact scan cell capture operations. For the scan cell internal defects that impact only scan capture operations, the number of failing bits are usually much smaller than regular scan chain failures that impact both scan chain capture and scan chain shifting operations. The number of failing bits for such defects are similar to those of system logic failures, e.g. usually only a few scan cells fail with only a few failing bits. Detection of these defects is impacted mainly by the appearance of the scan cell input combinations. For the other four test cases, their defect truth tables show that the defects have an impact on scan shift operations, but all of these four cases passed the regular chain test pattern. As stated above, the exemplary chain test pattern in the production test in this example for this circuit contains repeating "0011"s for all scan chains. This result demonstrates that the regular chain test pattern with repeating 0011s is not sufficient to detect some subtle scan cell internal defects.

TABLE 5

Scan Cell Internal Defect Detection

| Detection Status | #Cases | Further Analysis |
| --- | --- | --- |
| Passed chain test, Failed scan patterns | 25 | 4 cases has shift defect but no chain test failure<br>21 cases has no shift defect |
| No Failure (Undetected) | 3 | 1 out of 3 cases failed when simulating more scan patterns |
| Failed both chain test pattern and scan patterns | 50 | Similar to regular scan chain failures, these cases have massive failures |

In this experiment, there were three scan cell internal defects that are shown as "No Failure". These three defects escaped the chain test pattern and the first 100 scan test patterns. Further analysis of the defect truth tables shows that all of these three defects impact the scan cell capture operations only. To understand whether these defects can be activated if more scan test patterns are applied, these three scan cell internal defects were simulated using the full production test patterns with 99.9% test coverage. After simulation, it was found that one out of these three scan cell internal defects is detected while the other two scan cell internal defects still remain undetected. From these three defects, it was demonstrated that production test patterns with high fault coverage may not be sufficient to detect all possible subtle scan cell internal defects. However, since these defects impact scan cell capture operations, they might eventually show up during functional test or system test, or maybe as failed in the field. It would be helpful to measure how exhaustively a scan cell is tested and to add additional test patterns to improve defect coverage for subtle scan cell internal defects.

To summarize, regular chain test pattern and production test patterns may not be sufficient to detect all possible subtle scan cell internal defects. Even though the production test patterns may have very high stuck-at fault coverage, they may not provide all possible input combinations to activate a scan cell internal defect. It is desirable to provide all possible input combinations to scan cells in order to improve defect coverage for scan cell internal defects.

Diagnosis of Scan Cell Internal Defects

Recent scan chain failure diagnosis techniques focus on using well established fault models. While these fault models have been very successful, the diagnosis of scan cell internal defects based on these fault models may not be sufficient. This section first contains an evaluation of the effectiveness of the previously published scan chain failure diagnosis techniques in diagnosing scan cell internal defects. An enhanced method is also disclosed that uses a scan cell internal fault model to improve the diagnostic resolution for scan cell internal defects.

An experiment was set up to understand the effectiveness of previously published scan chain failure diagnosis techniques in isolating scan cell internal defects. Similar to the experiment in Section 4, in this experiment, the same industrial circuit was used and the 50 scan cell internal defects that are detected by both the scan chain test pattern and scan test patterns in Table 4. For each selected scan cell defect, its defect truth table was used to replace the selected scan cell. Each time a single defective scan cell was injected into the circuit for fault simulation. The fault simulator simulated the circuit for each scan shift cycle. The output of the defective scan cell at each scan shift cycle was calculated based on the defect truth table. The failures caused by the defective scan cells were logged into a file and these failures were used as observed failures in this experiment.

The observed failures for each defective scan cell were then fed to a scan chain diagnosis tool. The scan chain diagnosis tool in this experiment used scan chain failure diagnosis techniques based on traditional fault models with some relaxation techniques. Table 6 shows the results of the diagnosis of the 50 scan cell internal defects. From Table 6, it can be seen that, out of the 50 diagnosis cases, 22 of them have very good diagnosis resolution with 5 or less suspect scan cells. There are 7 diagnosis cases that are classified as a "potentially" good diagnosis. These cases have more than 5 scan cells in the suspect lists, while the actual defective scan cells are ranked in the top 5. The remaining 21 diagnosis cases don't have good diagnosis results. They have more than five scan cells in the suspect list while the actual defective scan cell is not listed in the top 5. From this table, it is apparent that previous scan chain failure diagnosis techniques based on stuck-at, transition and hold-time fault models are effective in isolating about 60% of the scan cell internal defects. However, for the remaining 40% of scan cell internal defects, these techniques cannot provide good diagnostic resolution. In the next subsection of this disclosure, an enhancement technique is disclosed to improve the diagnostic resolution for scan cell internal defect diagnosis.

TABLE 6

Diagnosis Results of Previous Chain Diagnosis Techniques

| | #Cases | Note |
|---|---|---|
| Good Diagnosis | 22 | #Susp <= 5 |
| Potential Good diagnosis | 7 | #susp > 5 but the real defective cell ranked in top 5 |
| Bad diagnosis | 21 | #susp > 5 and the real defective cell not ranked in top 5 |

As can be seen from the preceding section, in the example described therein, existing scan chain failure diagnosis failed to provide good diagnosis for 40% of the non-stuck-at static scan cell internal defects. This is due to the fact that a scan cell internal defect may not behave as exactly as a stuck-at fault model. The complicated defect behavior of such faults can confuse the existing diagnosis techniques and lead to a large number of suspects. In this subsection, we introduce a new fault model, called "scan cell internal fault," to diagnose static scan cell internal defects. The behavior of a scan cell internal fault can be described by a defect truth table such as shown below.

Figure 4:
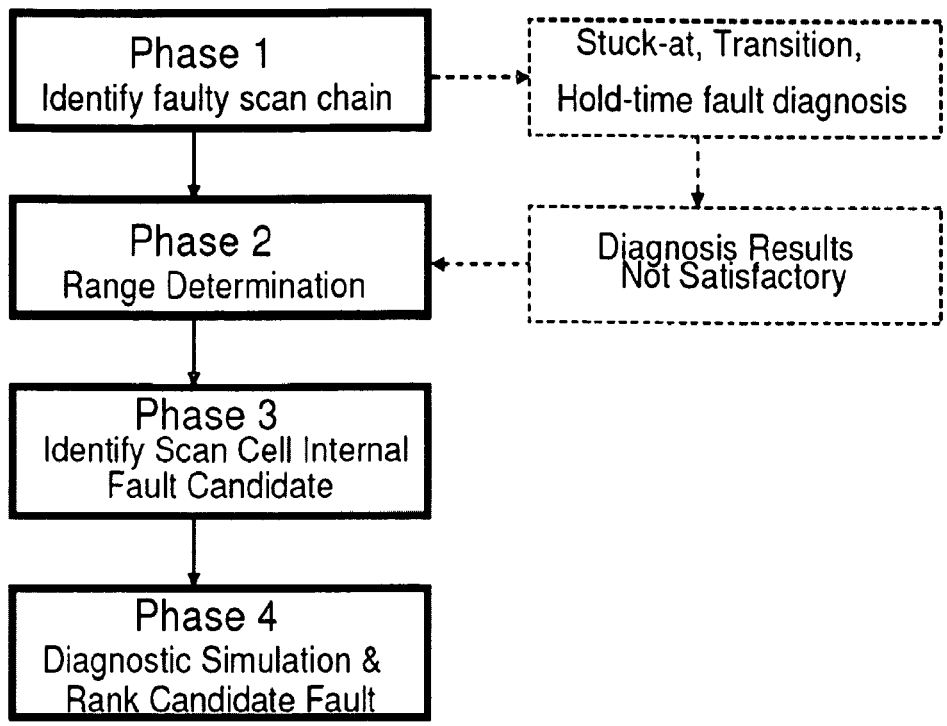
FIG. 4 illustrates an exemplary scan cell internal fault diagnosis flow that may be employed according to various embodiments of the invention.

FIG. 4 shows an exemplary scan chain failure diagnosis flow based on the scan cell internal fault model. The illustrated flow comprises four phases. Phase 1 identifies the failing scan chain based on scan chain test results and also identifies which fault type can be used to diagnose the faulty scan chain. Phase 2 involves finding the upper and lower bounds of the possible defective scan cells. Phase 3 collects a list of scan cell internal faults for further diagnosis analysis. In an exemplary approach, to identify a scan cell internal fault, the scan cell index and its defect truth table can be used. Once a candidate scan cell internal fault list is determined, diagnostic simulation is then performed to simulate the candidate faults. Candidate scan cells in the candidate list are desirably ranked based on how the candidate simulation failures match the observed failures. The first two phases are similar to those used in previous scan chain diagnosis techniques and are only briefly reviewed below. Phases 3 and 4 are explained in greater detail.

Based on the failure information of the scan chain test pattern, the identification of a failing scan chain is a straightforward process. After applying a scan chain test pattern, the observed values for each scan chain are compared with the expected good scan chain values. Any discrepancy between the expected values and the observed values indicates that the scan chain is impacted by a defect. Depending upon the faulty circuit value, one can further identify whether the scan chain is impacted by a stuck-at fault, transition fault or hold-time fault. Detailed analysis of scan chain failures to identify the fault type can be found in earlier publications and will not be repeated here. However, if the fault type is not one of the well established fault models, then one can continue with scan cell internal fault diagnosis as described below. Even if the fault type determined at this phase is one of the well-established fault types, if further diagnosis results based on the identified fault model don't provide good diagnostic resolution, scan cell internal fault diagnosis can be used to improve the diagnosis resolution. This is shown, for example, in FIG. 4 by the dashed route on the right hand side of the flow chart.

The purpose of this phase is to identify the upper and lower bounds of a defective scan cell. Usually this phase can reduce the number of candidate scan cells from the full scan chain to a relatively small number of candidate scan cells. Range determination techniques can be employed using Xs as the faulty scan chain load values to re-simulate the scan test patterns and compare the known binary values to the observed failures. For a scan cell internal defect, at this phase, the defect behavior (or defect truth table) is still not clear yet. Therefore, using X-masking to replace scan load values can effectively mask the impact of the defect on scan load values.

To identify an upper bound (UB), desirably, the observed failures on a faulty scan chain are used. In a specific example, first one can re-simulate the production test patterns by replacing the faulty chain scan load values with Xs. This masks the impact of a defect on the scan chain load process. Note that, with the load value Xs in the faulty chain, some scan cells may capture unknown values. For the faulty scan chain cells which capture binary values, these can be used to identify the upper bound of a defective scan cell. Once an upper bound is identified, one can further improve the determination of the upper bound iteratively by masking only the downstream scan cells of the current upper bound.

To identify a lower bound (LB), in a specific example one can use the observed failures on good scan chains. For each observed failure on a good scan chain, one can trace back from the failing scan cell to find its input cone, with the trace process stopping at a scan cell or primary input. Any faulty chain scan cell showing up in its input cone can possibly propagate its failure to this failing scan cell. When there are multiple faulty scan cells showing up in the input cone, the scan cell with the lowest index (i.e. the one closest to chain output) can be determined to be a lower bound of the scan cell internal defect. The highest lower bound among all good chain failing cells and among all failing scan patterns can be determined to be the lower bound of the scan cell internal defect.

In order to identify a scan cell internal fault candidate, one can identify which scan cell is the possible suspect and what is the defect truth table for each possible suspect. In this phase, the failure log collected from the production scan test patterns to identify the scan cell internal fault candidate can be used.

A scan cell internal defect may have an impact on both scan load/unload operations and scan capture operations. The values shifted out from the faulty scan cell depend on its input pin values. The input pin values for a scan cell can change from scan shift cycle to scan shift cycle. To monitor the behavior of each scan cell in the candidate range, each scan shift cycle can be simulated to obtain the scan cell input value combinations and the scan cell output values. An exemplary method of candidate scan cell internal fault identification is described in the following algorithm:

```
For scan cell N from UB to LB
    For test pattern S from first to last failing pattern
    (1) Change the scan load values of faulty chain cells [N, 0]to Xs.
    (2) Simulate the scan load values and get the capture values for all scan
        chains.
        (3) For each scan unload shift cycle,
            Record the input combinations C of cell N
        From observed values, get output value V of cell N at current shift
        cycle
            If C hasn't been applied on N, set V^N_c =V;
            Else if C has been applied on N and V^N_c==V
                Continue with the next cycle
            Else {
                Conflicting outputs for input C
                Cell N is not a candidate
        Continue with next scan cell
            }
```

The above algorithm operates to check whether a suspect scan cell produces the same output value when its input combinations are the same. In accordance with an embodiment, if a scan cell produces the same output values for the same input combinations, then this scan cell will be considered to be a candidate scan cell internal fault. In this embodiment, if a scan cell produces different output values for the same input combinations, this scan cell will not be considered as a scan cell internal fault candidate. For example, for a given scan cell A, if at cycle x its input combination is C and it produces an output value "1", and if at cycle y, its input combination is also C but it produces an output value "0", this indicates that scan cell A produces different values when the input combination is the same. Therefore, scan cell A doesn't have a static scan cell internal defect and will not be considered as a candidate scan cell internal fault in this exemplary diagnosis algorithm.

Figure 5:
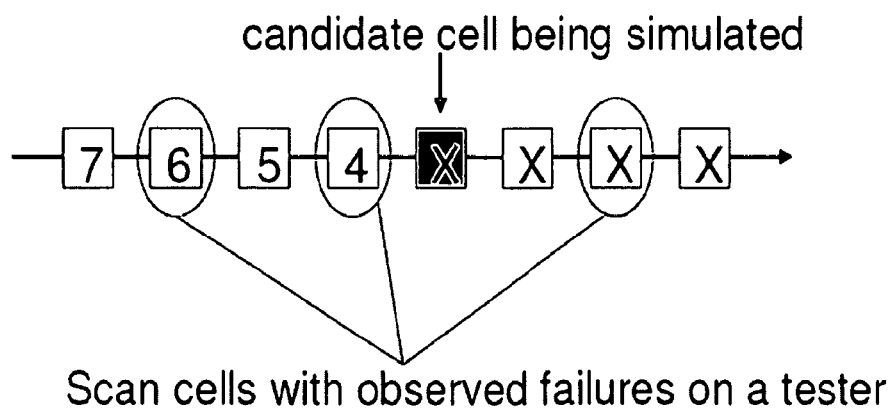
FIG. 5 illustrates scan chain load values.
Figure 6:
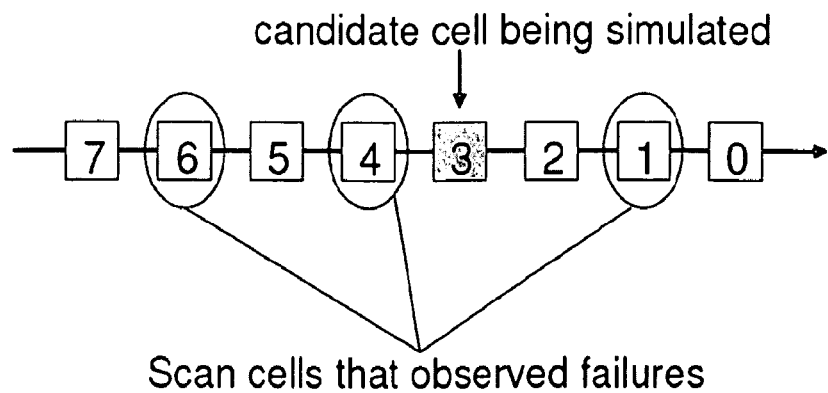
FIG. 6 illustrates an example faulty scan chain according to various examples of the invention.

In the above exemplary algorithm, for each scan cell N between the lower bound and upper bound, failing patterns can be simulated one by one to check whether the same input combinations produce the same output value or not. For each failing pattern, in order to mask the defect impact during the scan load process, the scan load values of downstream scan cells of cell N can be replaced with unknown value Xs, as shown in FIG. 5. The new scan load values with Xs in the faulty chain are then simulated to get the updated capture values for all scan chains. During scan unload simulation, one can simulate each scan unload shift cycle to check the input combinations of scan cell N and its corresponding scan cell output values. The scan cell N output values can be calculated based on the observed values at the scan chain output.

At a specific scan unload shift cycle, to know the output value produced by the current scan cell N, the observed values can be re-traced back to that suspect scan cell. Note that a binary value at scan cell N will be propagated to the scan chain output after N scan unload shift cycles. The observed values at the scan chain output are actually produced by the suspect scan cell N at N scan unload shift cycles earlier. To know the value produced by scan cell N at scan unload shift cycle "x", one can take the observed value at scan chain output at cycle "x" –N. When "x" is smaller than N, the values are actually the observed value on the downstream scan cells of scan cell N. For scan test patterns, the downstream scan cell values are not shifted through scan cell N during the scan unload process.

Figure 7:
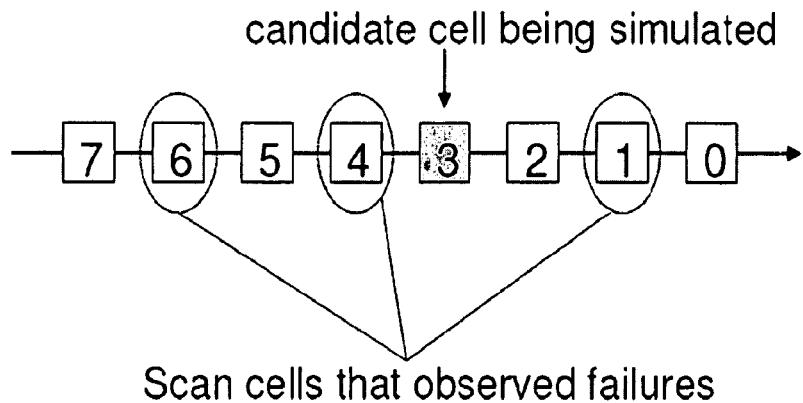
FIG. 7 illustrates a scan chain unload shift.
Figure 8:
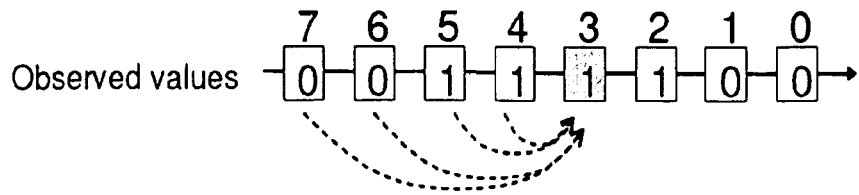
FIG. 8 illustrates observed values on a tester.

Consider the following explanatory example. As shown in FIG. 7, assume that there is a faulty scan chain with 8 scan cells. Also assume that the scan cell 3 is one scan cell that is within the lower and upper bounds of the suspect range. For a given scan pattern, assume that there are three failing bits observed on this scan chain at scan cells 1, 4 and 6. The observed values on a tester for all the scan cells are shown in FIG. 8. In order to check whether scan cell 3 is a candidate scan cell internal fault, the scan cell input combinations and the output values of scan cell 3 are checked to verify that the same input combinations produce the same output values. For each scan shift cycle, the output values at scan cell 3 can be calculated based on the observed values on a tester. As shown in FIG. 7, the observed value at scan cell 4 reaches scan cell 3 after one scan unload shift cycle. This means that the observed value for scan cell 4 is produced by scan cell 3 after the first scan unload shift cycle. If scan cell 3 is the actual defective scan cell, its input combination before the first scan unload shift cycle should determine the scan cell output value at scan unload shift cycle 1, which is the observed value for scan cell 4. Similarly, the observed value at scan cell 6 reaches scan cell 3 after the third scan unload shift cycle. This means the observed value of scan cell 6 is produced at the third scan cell unload cycle by scan cell 3. The input combination immediately prior to the third scan unload shift cycle should determine the scan cell output value for scan unload shift cycle 3.

After the scan cell input combinations and the corresponding scan cell output values for these input combinations are determined, a check can be made to determine whether an input combination consistently produces the same output values. If the same input combination always produces the same output value, then, in this example, this scan cell is considered to be a candidate for scan cell internal fault diagnostic simulation in the next phase. Otherwise, this scan cell is not a candidate for scan cell internal fault diagnostic simulation. The scan unload values of the downstream scan cells of scan cell 3 are not used in this specific example for candidate fault pruning because the output values of downstream scan cells don't go through scan cell 3 before they are being observed at the scan chain output. Therefore, such output values do not directly correspond to scan cell input combinations at scan cell 3 during the scan chain unload process. However, the observed values in these scan cells can be used in phase 4 during diagnostic fault simulation.

For each candidate scan cell internal fault identified in the above method, both the scan cell location, and the truth table to describe its defective behavior are known. The scan cell location and its defect truth table can then be used in the next phase during diagnostic fault simulation.

In many cases, the candidate fault identification process at phase 3 will generate one or more scan cell internal faults as candidates. Diagnostic simulation can then be performed for all the candidate scan cell internal faults. In this phase, the original production test patterns and the observed failures collected for production test patterns can be used to further validate or improve diagnostic resolution.

When there is only a single candidate scan cell internal fault, this phase will simply simulate the candidate scan cell fault and validate that it produces the same failures as shown when implemented, such as on silicon. When there are more than one candidate scan cell internal faults, this phase will desirably simulate all candidate scan cell internal faults and rank them based on several diagnostic metrics. In a desirable diagnosis flow, a plurality of diagnostic metrics is used. For example, three diagnostic metrics to evaluate how good the candidate simulation failures match observed failures.

The three exemplary metrics are:
a. SFTF: Number of failures that are predicted by candidate fault simulation that match with observed failures;
b. SFTP: Number of failures that are predicted by candidate fault simulation, but these failures do not match any observed failures on a tester; and
c. SPTF: Number of failures that are not predicted by candidate fault simulation but these failures appear in observed failures on a tester.

The exemplary scan cell internal fault diagnosis method was implemented and applied to the 50 test cases discussed above to evaluate the previous existing diagnosis techniques. For the 22 diagnosis test cases where the existing diagnosis techniques performed very well and the 7 diagnosis test cases where the existing diagnosis techniques have potential useful results, the new method with a scan cell internal fault model performs just as good or even better. For all of the 29 cases, the new diagnosis method can identify the defective scan cell down to a single scan cell which is the actual defective scan cell.

The new proposed diagnosis method worked very well on the vast majority of the 21 test cases where the existing scan chain diagnosis techniques failed to achieve good diagnostic resolution. Scan chain failures usually create massive failures for scan test patterns. In this experiment, the failures collected on the first 30 scan test patterns from the production test pattern set were used. The diagnosis results are shown in Table 7, below.

TABLE 7

Scan Cell Internal Fault Diagnosis Results

| | #CellRange | #Candidate | #FinalSuspect |
|---|---|---|---|
| 1 | 6 | 1 | 1 |
| 2 | 10 | 1 | 1 |
| 3 | 14 | 1 | 1 |
| 4 | 12 | 1 | 1 |
| 5 | 24 | 23 | 23 |
| 6 | 42 | 1 | 1 |
| 7 | 39 | 1 | 1 |
| 8 | 85 | 12 | 1 |
| 9 | 52 | 52 | 52 |
| 10 | 50 | 28 | 1 |
| 11 | 6 | 1 | 1 |
| 12 | 6 | 1 | 1 |
| 13 | 9 | 1 | 1 |
| 14 | 7 | 1 | 1 |
| 15 | 42 | 42 | 1 |
| 16 | 86 | 1 | 1 |
| 17 | 86 | 17 | 1 |
| 18 | 59 | 1 | 1 |
| 19 | 33 | 11 | 1 |
| 20 | 32 | 13 | 1 |
| 21 | 138 | 59 | 1 |

From Table 7, it is apparent that for 19 out of 21 cases, the disclosed diagnosis method can uniquely identify the defective scan cell. More specifically, in this example, after phase 3, more than half of these cases (e.g. 12 out of 21 cases), there was only a single candidate scan cell internal fault. For these cases, phase 4 just simply confirmed that the diagnostic fault simulation failures of the scan cell internal fault do match the observed failures. For the remaining 9 test cases, phase 4 diagnostic fault simulation identified a single failing scan cell for 7 of them. For the other 2 test cases, there was still more than one scan cell internal fault identified as candidates after phase 4. This arose because, for the production test patterns used in this experiment, the candidate scan cell internal faults produced the same failures that match the observed failures. For these two test cases, additional diagnostic-oriented test patterns can be used to further improve the diagnostic resolution. Comparing these results with existing scan chain failure diagnosis techniques that reported more than 5 suspects for each of these cases (as shown in Table 7), the new diagnosis method effectively isolates 19 out of 21 test cases down to a single defective scan cells. This is a significant improvement and shows the effectiveness of the new diagnosis method.

During scan cell internal fault diagnosis, simulation of each scan unload shift cycle in phase 3 used in one example to identify the scan cell internal fault candidate and in phase 4 to perform diagnostic fault simulation for all candidate scan cell internal faults. In general, simulation of each scan shift cycle can be a time-consuming process. However, in an exemplary diagnosis flow, at phase 3, once a fault is identified to have conflicting output values for the same input value combination, it can be dropped immediately. Thus, there is no need to simulate the remaining patterns or the remaining scan unload cycles. In these experiments, it was observed that, at phase 3, most false candidates between the lower and upper bounds can be dropped in the first several patterns. For diagnostic fault simulation at phase 4, desirably a simulation is performed of all the candidate faults on all the failing patterns to collect diagnostic metric data for each candidate fault. As can be seen from Table 7, the number of scan cell internal candidate faults is usually small at phase 4. In the exemplary experiment, depending on the number of scan cells identified in the range determination phase and the number of candidate faults in the candidate fault list at phase 3, the diagnosis CPU times for these example test cases ranged from 2 minutes to up to about 30 minutes on a Linux workstation with Intel Xeon CPU of 3 GHz and 8 GB of memory.

The disclosed static scan cell internal fault diagnosis can be extended to support designs with embedded test compression logic. When there is compression logic, the first two phases and phase 4 of the disclosed diagnosis flow can be used without any change. In phase 3, the observed values of the faulty scan chain are not directly available. What is observed at the output channel is the compressed value of all scan chains by XORing the internal scan chain values in the same output channel. While targeting scan cell N, the output value of scan cell N at a specific scan unload shift cycle is calculated based on the observed value at the output channel and the values of other internal scan chains in the same output channel. Given the observed value at the channel output and the output values of other internal scan chains in the same channel, the XOR process is reversed to get the faulty chain output value. Once the faulty chain output value is known, the consistency check for the input combinations can be applied to scan cell N. Note that if any internal scan chain in the same output channel as the faulty chain has an X at a scan unload shift cycle, that scan unload cycle is not used for consistency check.

Conclusion

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

What is claimed is:

1. A method of scan cell internal defect diagnosis, comprising:
   identifying a failing scan chain;
   determining an upper bound and a lower bound of candidate scan cells in the failing scan chain; and
   identifying one or more scan cell internal fault candidates in the candidate scan cells based on a failure log and failing scan test patterns associated with the failure log, wherein the one or more scan cell internal fault candidates are for one or more static scan cell internal defects that exhibit static defect behavior but that do not behave as stuck-at faults and also do not behave as transition faults, wherein the static scan cell internal defect is a resistive short or open, and wherein the static defect behavior is characterized by a faulty output value being consistently output from a scan cell output for a respective combination of input values at scan cell inputs, the faulty output value being 0 for at least one combination of input values and being 1 for at least another combination of input values.

2. The method recited in claim 1, further comprising:
performing a diagnostic simulation process for the one or more scan cell internal fault candidates.

3. The method recited in claim 2, further comprising:
ranking the one or more scan cell internal fault candidates based on results of the diagnostic simulation process.

4. The method recited in claim 1, wherein the identifying a failing scan chain is based on applying one or more scan test patterns, or one or more chain test patterns, or both.

5. The method recited in claim 1, wherein the identifying one or more scan cell internal fault candidates comprises:
selecting a candidate scan cell from the candidate scan cells;
determining whether the candidate scan cell has a same output value for identical input combinations based on a failure log and failing scan test patterns associated with the failure log.

6. The method recited in claim 5, wherein the identifying one or more scan cell internal fault candidates further comprises:
repeating the selecting and the determining until all of the candidate scan cells are selected.

7. The method recited in claim 5, wherein the determining whether the candidate scan cell has a same output value for identical input combinations comprises:
changing scan load values of the candidate scan cell and downstream scan cells to Xs; and
performing a simulation process using one or more of the failing scan test patterns to determine input combinations of the candidate scan cell during various unload shift cycles.

8. A non-transitory storage medium storing processor-executable instructions for causing one or more processors to perform a method of scan cell internal defect diagnosis, the method comprising:
identifying a failing scan chain;
determining an upper bound and a lower bound of candidate scan cells in the failing scan chain; and
identifying one or more scan cell internal fault candidates in the candidate scan cells based on a failure log and failing scan test patterns associated with the failure log, wherein the one or more scan cell internal fault candidates are for one or more static scan cell internal defects that exhibit static defect behavior but that do not behave as stuck-at faults and also do not behave as transition faults, wherein the static scan cell internal defect is a resistive short or open, and wherein the static defect behavior is characterized by a faulty output value being consistently output from a scan cell output for a respective combination of input values at scan cell inputs, the faulty output value being 0 for at least one combination of input values and being 1 for at least another combination of input values.

9. The storage medium recited in claim 8, wherein the method further comprises:
performing a diagnostic simulation process for the one or more scan cell internal fault candidates.

10. The storage medium recited in claim 9, wherein the method further comprises:
ranking the one or more scan cell internal fault candidates based on results of the diagnostic simulation process.

11. The storage medium recited in claim 8, wherein the identifying a failing scan chain is based on applying one or more scan test patterns, or one or more chain test patterns, or both.

12. The storage medium recited in claim 8, wherein the identifying one or more scan cell internal fault candidates comprises:
selecting a candidate scan cell from the candidate scan cells;
determining whether the candidate scan cell has a same output value for identical input combinations based on a failure log and failing scan test patterns associated with the failure log.

13. The storage medium recited in claim 12, wherein the identifying one or more scan cell internal fault candidates further comprises:
repeating the selecting and the determining until all of the candidate scan cells are selected.

14. The storage medium recited in claim 12, wherein the determining whether the candidate scan cell has a same output value for identical input combinations comprises:
changing scan load values of the candidate scan cell and downstream scan cells to Xs; and
performing a simulation process using one or more of the failing scan test patterns to determine input combinations of the candidate scan cell during various unload shift cycles.

\* \* \* \* \*